United States Patent [19]

Karner

[11] Patent Number: 4,818,240

[45] Date of Patent: Apr. 4, 1989

[54] POWER RAILS FOR EDGE MOUNTING MODULES

[75] Inventor: Friedrich A. Karner, Milton, Vt.

[73] Assignee: International Business Machines Corporation, Armonk, N.Y.

[21] Appl. No.: 114,961

[22] Filed: Oct. 30, 1987

[51] Int. Cl.⁴ ............................................. H05K 1/14
[52] U.S. Cl. ...................................... 439/64; 439/377
[58] Field of Search .................................. 439/59–63, 439/64, 377; 211/41; 361/415, 413

[56] References Cited

U.S. PATENT DOCUMENTS 3,673,669  7/1972  Edstrom et al. ..................... 439/377
3,812,402  5/1974  Garth .................................... 439/83

Primary Examiner—Neil Abrams
Attorney, Agent, or Firm—Theodore E. Galanthay; William N. Hogg

[57] ABSTRACT

A structure for edge mounting chip modules to planar boards is provided. The structure includes a pair of spaced side rails mounted on a support structure extending generally parallel to each other. The rails each have first and second strips, insulated from each other, the strips each having projections extending therefrom and defining slots therebetween to receive the edges of the chip modules. Each strip is provided with an independent power level, whereby four distinct power levels can be supplied to the chip modules.

5 Claims, 6 Drawing Sheets

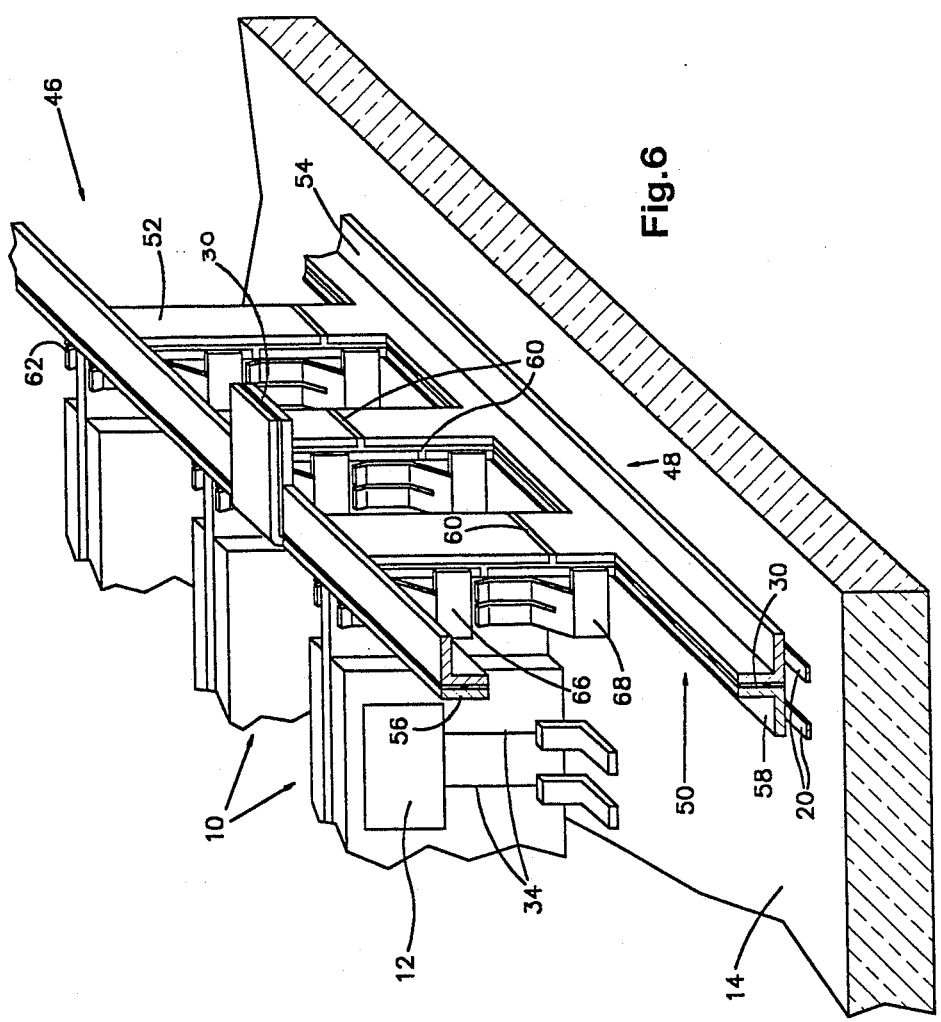

POWER RAILS FOR EDGE MOUNTING MODULES

BACKGROUND OF THE INVENTION

1. Field of the Invention

This invention relates generally to connections of computer components, and more particularly to connections in computers where one level of electronics is connected to another level, e.g., wherein substrates mounting I.C. chips are connected to printed circuit boards or the like. In even more particular aspects, this invention relates to a novel technique for edge connecting I.C. chip modules to planar boards to provide multiple levels of voltage in addition to ground level to the chips.

2. Description of the Prior Art

As the complexity of I.C. chips and chip packaging increases with continued miniaturization, and the addition of more functions and circuits to the chips and more chips to substrates, there is an increasing demand for packaging and connecting techniques which will allow multiple voltage levels in addition to a ground level or multiple ground levels to be applied to the substrate mounting the chips, while maintaining a compact, high density, efficient, simple and reliable structure, and at the same time provide mechanical support to the package.

One way of providing such an efficient high density structure is often accomplished by arranging the modules mounting the I.C. chips in a stacked array, supporting their edges, and bringing power to the edges of the modules and from the edges to the chips. However, this technique heretofore has not permitted multiple voltages in addition to ground to be applied to the substrate, it having been limited to bringing ground or voltage into one edge and operating voltage to the other edge; e.g. see U.S. Pat. No. 3,812,402 to Garth entitled "High Density Digital Systems with Their Method of Fabrication with Liquid Coating for Semi-Conductor Circuit Chips." This reference depicts a technique for the so-called edge connecting of substrates mounting I.C. chips in which a ground/voltage is introduced at one edge of the substrate and a single power/voltage is introduced at the opposite edge of the substrate. The edge connections also serve to support the substrates on an underlying structure, which can be a panel, or another level of packaging such as a printed circuit board or the like.

While this is an effective way of arraying substrates containing I.C. chips, nevertheless this technique as described is limited to a single ground plane and a single voltage plane, and as described above, the advances in I.C. technology make it desirable and sometimes necessary to have multiple levels of voltage in addition to the ground plane applied to the chips.

SUMMARY OF THE INVENTION

An edge support and power distribution structure for supporting and delivering power at multiple levels to a substrate mounting one or more integrated circuit chips is provided. The structure includes a pair of spaced side rails mounted on a support member (such as a printed circuit board) and running generally parallel to each other. Each side rail is comprised of first and second electrically conducting strips of material separated by an electrically insulating material, and each of the strips of each rail has projections extending therefrom which lie on spaced planes and define therebetween a slot to receive one edge of a substrate. The slots on opposite side rails are in general alignment with each other to receive opposite ends of a module. Means are provided to deliver power levels to each strip independently, whereby one of said strips can act as a ground plane and the others can each act as a separate voltage level supply.

DESCRIPTION OF THE DRAWINGS

FIG. 6 is a perspective view similar to FIG. 3 showing another embodiment of the invention which permits additional levels of voltage to be applied.

DESCRIPTION OF THE PREFERRED EMBODIMENTS

Figure 1:
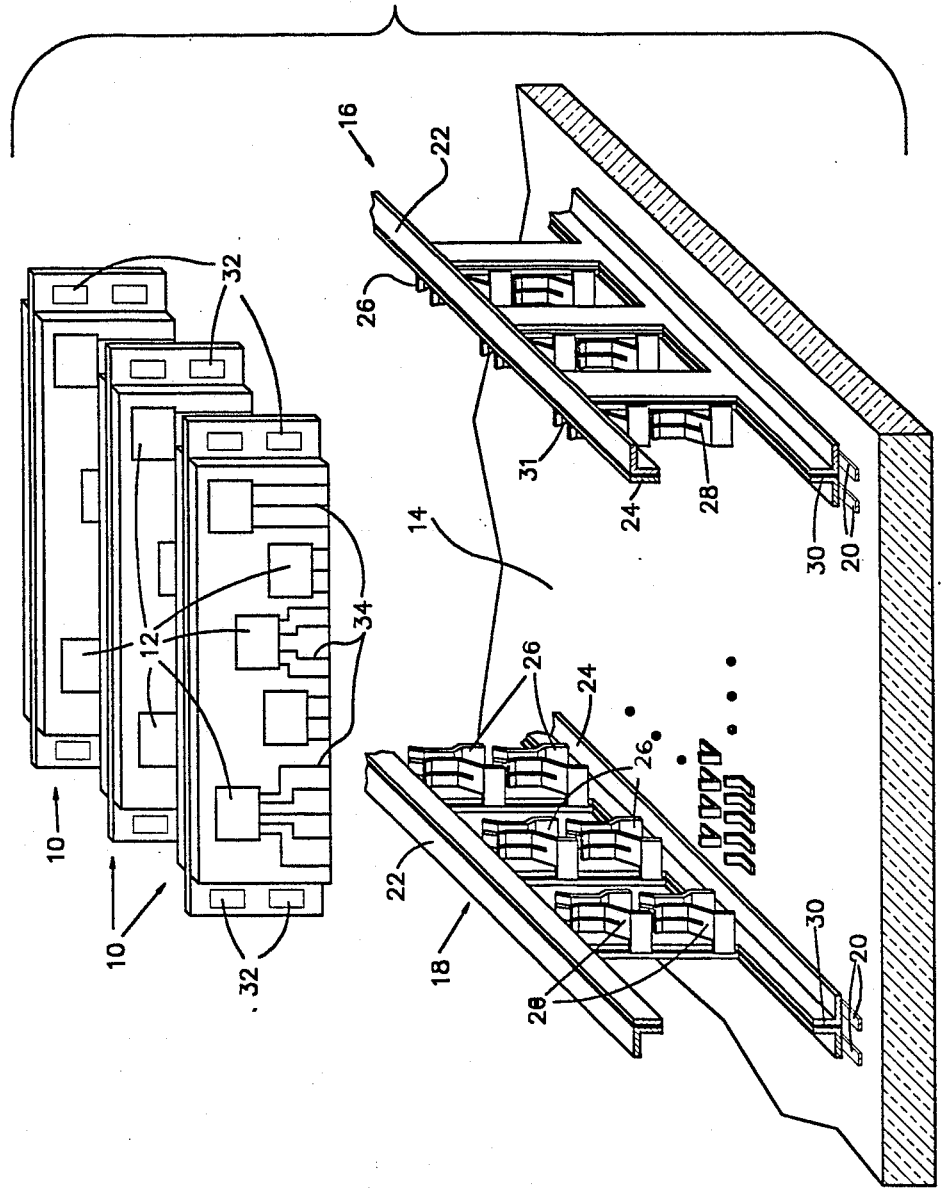
FIG. 1 is an exploded perspective view showing the edge connection structure of this invention and a substrate mounting integrated circuit chips positioned for insertion therein.
Figure 2:
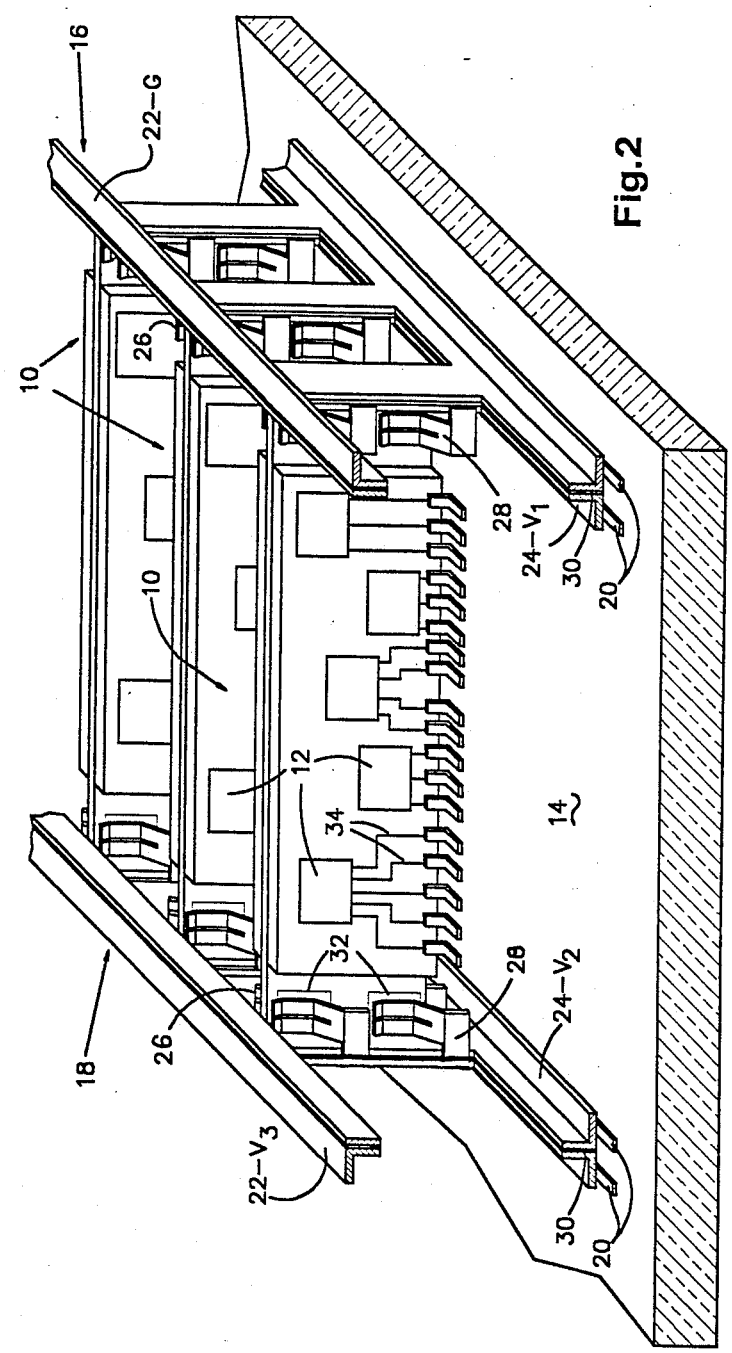
FIG. 2 is a perspective view similar to FIG. 1 showing the same structure with the substrate containing the chips supported in position.

Referring now to the drawings, and for the present to FIGS. 1 through 5, an edge mounting device according to this invention is shown which is adapted to mount substrates 10 carrying one or more integrated circuit chips 12, onto a ceramic or organic electronic card or printed circuit board 14, and to provide electrical interconnection to the substrate 10, and hence to the chips 12. The mounting structure includes a pair of side rails 16, 18 (FIGS. 1 and 2). The side rails are mounted on the card 14 by suitable means, such as by a solder connections 20, and extend along the card 14 generally parallel to each other. The rails 16 and 18 are mirror images of each other, and hence the structure of only one need be described in detail.

Figure 3:
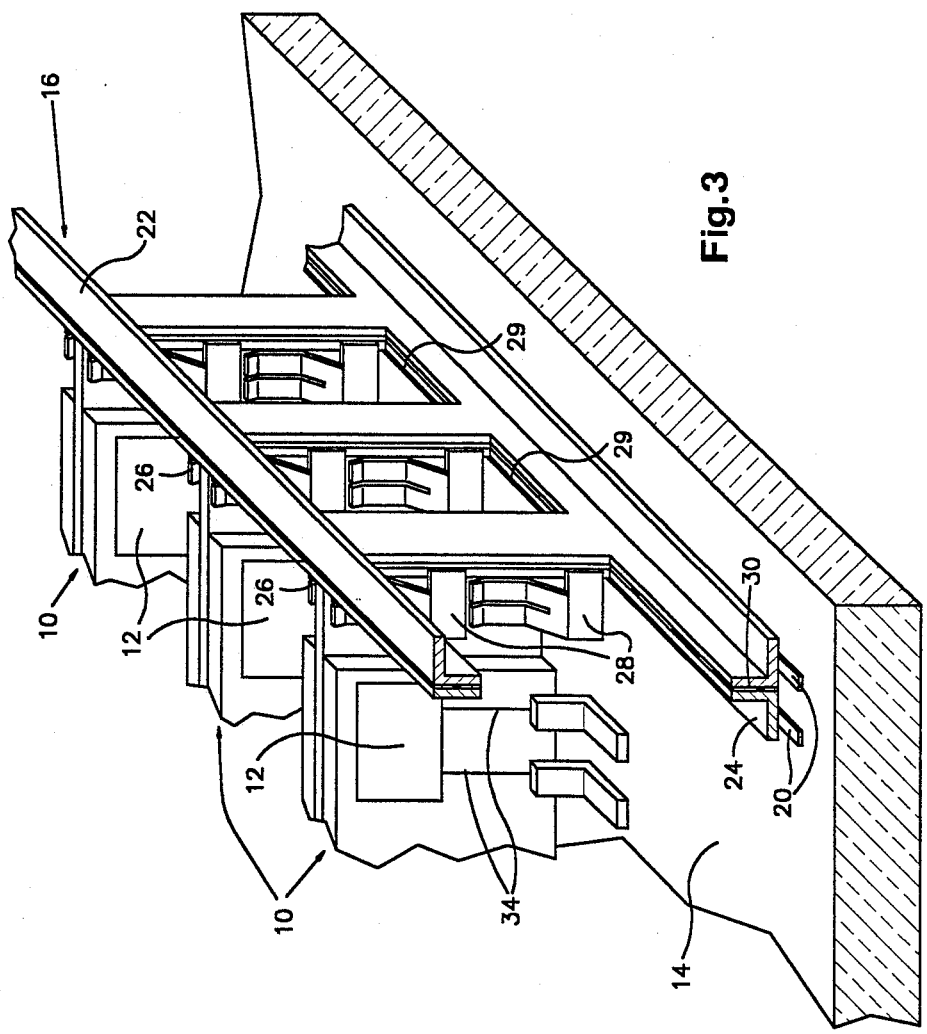
FIG. 3 is a perspective view, partially in section showing a portion of one of the side rails.
Figure 5:
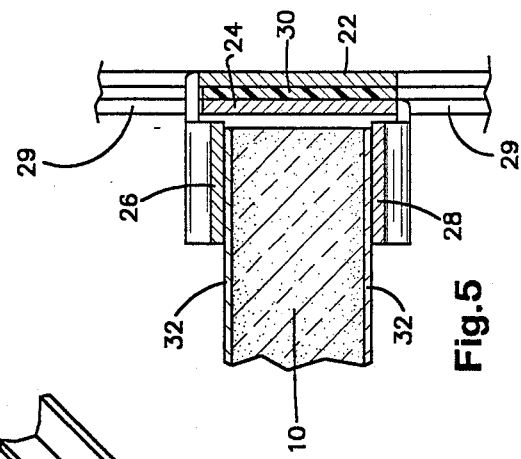
FIG. 5 is a longitudinal sectional view of a portion of the two strips of one side rail joined by an insulating material, with the edge of a module supported therein shown in broken outline.
Figure 4B:
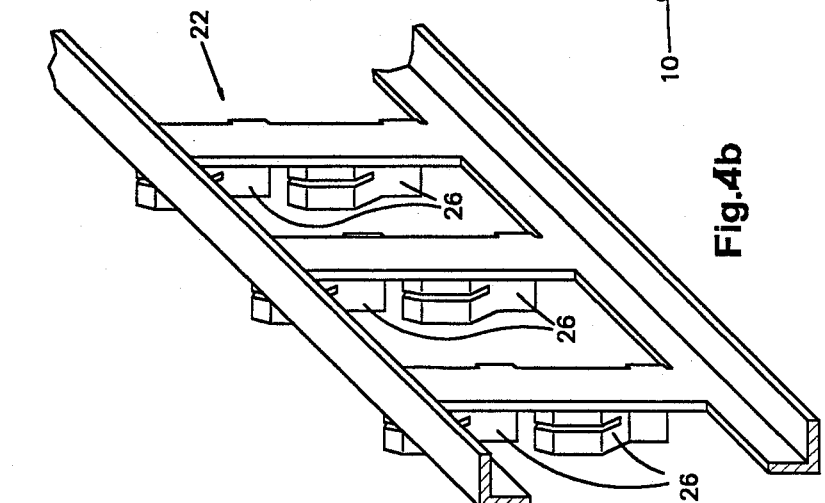
FIG. 4b is a perspective view of a portion of the other strip of one side rail.
Figure 4A:
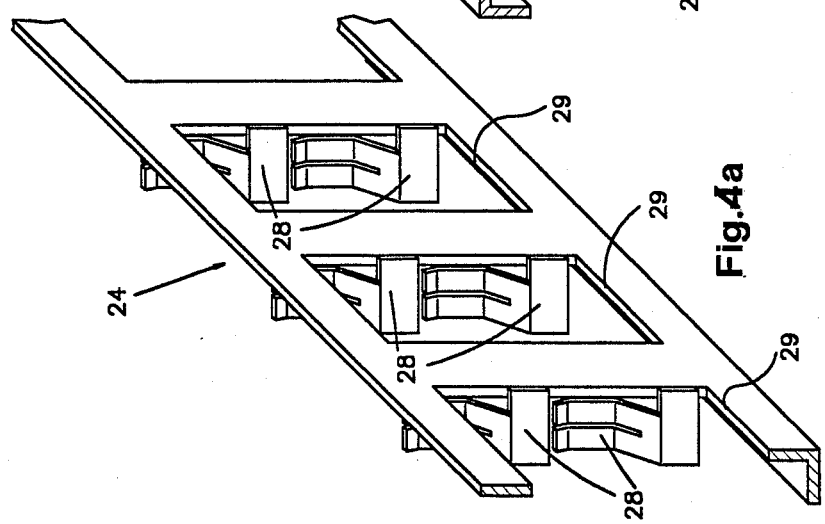
FIG. 4a is a perspective view of a portion of one strip of one side rail.

Each side rail is comprised of a pair of metal strips 22 and 24. The strip 22 has a pair of ears or projection 26 bent and formed to extend normal to the strip 22 as shown in FIG. 4b, and the strip 24 has a pair of ears or projections 28 bent and formed to extend normal to the strip 24 as shown in FIG. 4a. Preferably each of the strips 22 and 24 are separately formed in a progressive die as is well known in the art with the strip 24 including windows or openings 29 through which the projection 26 of the strip 22 can project when the strips are assembled. After forming, the strips are laminated together by an electrically insulating adhesive material 30, as shown in FIG. 3 and 5. Various materials can be used. For example, for relatively low capacitance requirements, a fiberglass cloth impregnated with epoxy resin or polyimide can be used with very satisfactory results. For higher capacitance requirements, a fiberglass cloth coated on both sides with an epoxy or polyimide filled with high dielectric fillers such as barium titanate or strontium titanate, or similar compounds can be utilized. As can be seen in FIGS. 1 and 5, the projections 26 on strip 22 are spaced apart from projections 28 on strip 24 and extend normal to the strips to form therebetween a channel 32 adapted to receive and support one edge of a substrate. To snugly secure the substrate edge, the projections 26 and 28 are bent to a leaf spring configuration as can best be seen in FIG. 3. Each strip 22 and 24 of each rail 16, 18 is insulated electrically from the other and each is independently connected to a desired voltage level. For example, a strip of one rail could be connected to ground designated G, and each of the other three connected to a separate and independent voltage level denoted $V_1$, $V_2$, $V_3$ (FIG. 2). The projections 26, 28 on each rail make contact with suitable metal pads 32 on the surface of the substrate 10 which pads 32 are connected through surface wiring and vias to the various chips 12 on the substrate, and snug mechanical and electrical connection is maintained by the spring configuration of the ears 26 and 28.

Since the metal strips 22 and 24 act as both electrical connections and as support members for the substrate 10, it is necessary that they have both good mechanical support strength as well as high electrical conductivity. One very suitable material is beryllium-copper, another choice is phosphorbronze, and there are many other industrially available suitable contact materials that have good spring characteristics to maintain good contact of the projections 26, and 28 with the pads 32, and have sufficient spring characteristics to support the substrate in place. If low thermal expansion is desired, a suitable material for this type of application is copper clad invar, such as is sold by Texas Instruments Corp.

As can be seen in FIG. 3, the signal lines 34 attach along the lower edge portion of the substrate 10 to provide signal communication to and from the chips 12 mounted on the substrate. These can be merely spring contacts or may be a more permanent and reliable solder reflow connection, if desired. Both techniques are well known in the art.

Figure 7B:
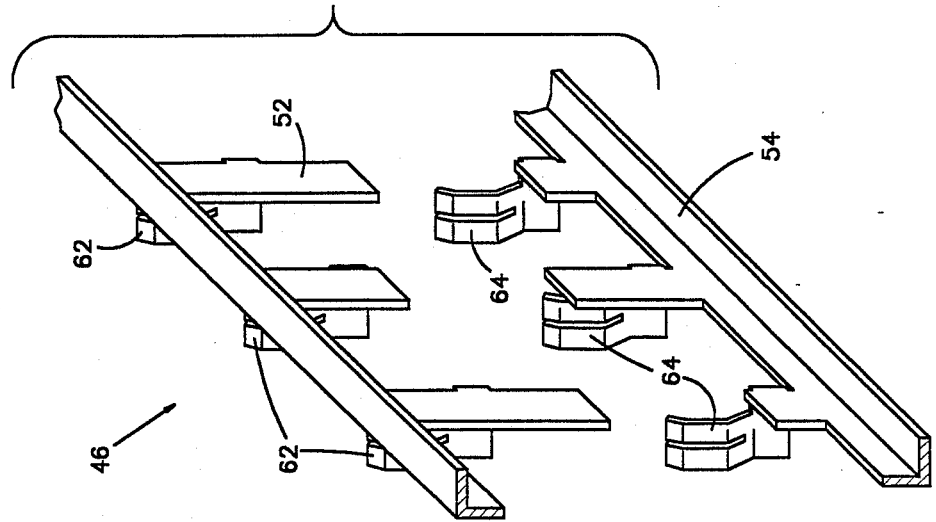
FIGS. 7a and 7b perspective view of the two strips that form the embodiment of one side rail shown in FIG. 6.
Figure 7A:
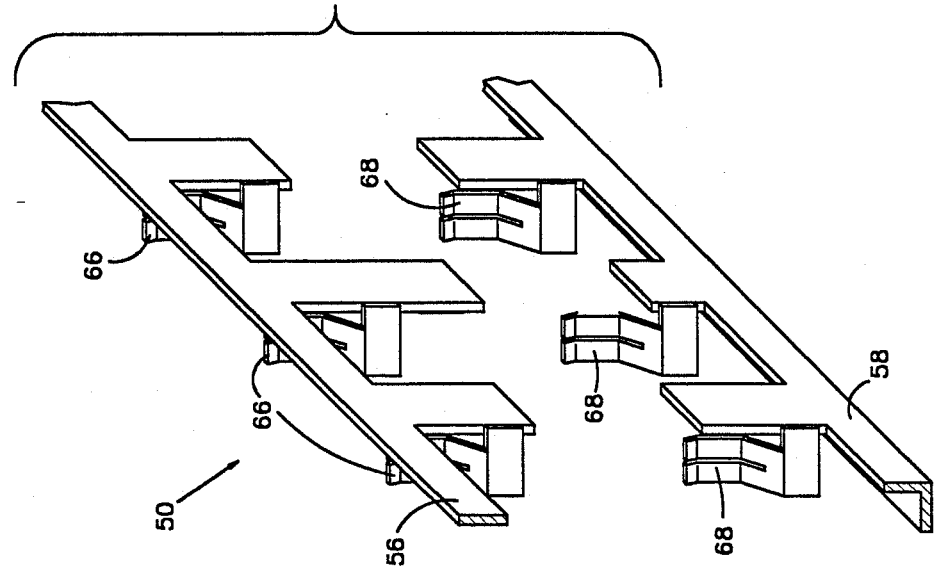

Referring now to FIGS. 6 and 7a and 7b, another embodiment of the invention is shown. This embodiment is similar to the embodiment of FIGS. 1-5, except that each side rail can provide up to four different power levels instead of two.

In this embodiment side rails one of which is shown as 46 are comprised of two strips 48, 50; each strip 48 is comprised of two sections 52, 54, and each strip 50 is comprised of two sections 56, 58. In each case the two sections of the strips are separated by an electrical insulating material 60 which can be the same as the insulating material 30 which separates the strips 48 and 50. In this embodiment, section 52 has a projection 62, section 54 has a projection 64, section 56 has a projection 66 and section 58 has a projection 68. Thus there are four electrically separate strips and projections on each side rail thus allowing four separately selectable voltage levels on each rail. Hence with two side rails, a total of eight different voltage levels is attainable, and allowing for one ground plane, up to seven applied voltages for operating the chips 12 can be provided.

Although the invention has been described in some degree of particularity, various adaptations and modifications can be made without departing from the scope of the claims.

What is claimed is:

1. An edge support and power distribution structure for supporting and delivering power at multiple voltage levels to at least one substrate mounting at least one integrated circuit chip comprising:
   a support member,
   a pair of spaced side rails mounted on said support member and extending generally parallel to each other,
   each side rail comprised of first and second electrically conducting strips of material separated by an insulating material,
   said first and second strips of conducting material having projections formed thereon extending generally normal thereto and lying on spaced planes to define therebetween a slot to receive one edge portion of a substrate, said slots on opposite side rails being generally aligned, and means to provide power levels independently to each strip of each side rail,
   whereby said side rails act as substrate supports and also provide power to at least four separately determined voltage levels.

2. The invention as defined in claim 1 wherein at least one of said strips of conducting material has first and second parallel segments separated by an insulating material, and wherein each segment has at least one projection, whereby each strip of conducting material having two segments can be supplied with power at two independently determined levels.

3. The invention as defined in claim 1, or 2 wherein the projections of said second strip project through openings formed in said first strip.

4. The invention as defined in claim 1, or 2 wherein said projections are bent to a spring configuration to resiliently engage the edge portions of said substrates.

5. The invention as defined in claim 1, or 2 wherein said rails are identical to each other and are defined in mirror image relationship of each other.

* * * * *